US012385493B2

(12) United States Patent
Chang et al.

(10) Patent No.: US 12,385,493 B2
(45) Date of Patent: Aug. 12, 2025

(54) FAN

(71) Applicant: DELTA ELECTRONICS, INC., Taoyuan (TW)

(72) Inventors: Shun-Chen Chang, Taoyuan (TW); Chao-Fu Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 18/511,850

(22) Filed: Nov. 16, 2023

(65) Prior Publication Data

US 2024/0084810 A1 Mar. 14, 2024

Related U.S. Application Data

(62) Division of application No. 16/022,192, filed on Jun. 28, 2018, now Pat. No. 11,867,188.

(30) Foreign Application Priority Data

Oct. 11, 2017 (CN) .......................... 201710943492.1

(51) Int. Cl.
*F04D 25/06* (2006.01)
*F04D 17/06* (2006.01)
(Continued)

(52) U.S. Cl.
CPC ......... *F04D 25/0606* (2013.01); *F04D 17/06* (2013.01); *F04D 19/02* (2013.01);
(Continued)

(58) Field of Classification Search
CPC .. F04D 25/0606; F04D 17/06; F04D 29/4226; F04D 29/441; F04D 19/02;
(Continued)

(56) References Cited

U.S. PATENT DOCUMENTS 5,385,447 A 1/1995 Geister
7,726,939 B2 * 6/2010 Lee ....................... F04D 29/544
415/220

(Continued)

FOREIGN PATENT DOCUMENTS

CN 104121230 A 10/2014
CN 104214139 A 12/2014
(Continued)

OTHER PUBLICATIONS

Raw Machine Translation of EP2677174, Lichau Christian, "Fan and electric motor", Dec. 25, 2013.*
(Continued)

*Primary Examiner* — Essama Omgba
*Assistant Examiner* — Lilya Pekarskaya
(74) *Attorney, Agent, or Firm* — MUNCY, GEISSLER, OLDS & LOWE, P.C.

(57) ABSTRACT

A fan includes a fan frame and a driving device. The fan frame includes a base, a frame shell and static blades arranged on the periphery of the base. The driving device includes a stator structure and a rotor structure. The stator structure includes a stator magnetic pole group and a bushing. The rotor structure includes a bearing, a shaft, a rotor shell, a magnetic structure, a magnetic shell and blades. The shaft is connected with the rotor shell and disposed through the bearing. The stator magnetic pole group magnetically drives the magnetic structure to rotate the rotor shell. Two ends of the frame shell are configured with two turning portions, respectively. The two turning portions are disposed between parts of the frame shell with different curvatures. A curvature of the first turning portion is larger than a curvature of the second turning portion.

12 Claims, 8 Drawing Sheets

(51) Int. Cl.
- *F04D 19/02* (2006.01)
- *F04D 25/08* (2006.01)
- *F04D 29/42* (2006.01)
- *F04D 29/44* (2006.01)
- *G06F 1/20* (2006.01)
- *H02K 7/14* (2006.01)
- *H05K 7/20* (2006.01)

(52) U.S. Cl.
CPC ......... *F04D 25/08* (2013.01); *F04D 29/4226* (2013.01); *F04D 29/441* (2013.01); *G06F 1/20* (2013.01); *H02K 7/14* (2013.01); *H05K 7/20172* (2013.01); *H05K 7/20136* (2013.01)

(58) Field of Classification Search
CPC .... F04D 25/08; F04D 25/064; F04D 25/0646; F04D 29/522; H05K 7/20172; H05K 7/20136; G06F 1/20; H02K 7/14
See application file for complete search history.

(56) References Cited

U.S. PATENT DOCUMENTS

| | | |
|---|---|---|
| 2009/0142204 A1 | 6/2009 | Yamamoto |
| 2011/0156520 A1 | 6/2011 | Mai |
| 2011/0255239 A1 | 10/2011 | Franz |
| 2014/0356149 A1 | 12/2014 | Chang et al. |
| 2016/0178265 A1 | 6/2016 | Lee |
| 2018/0266440 A1* | 9/2018 | Shiozawa ................ H02K 9/06 |

FOREIGN PATENT DOCUMENTS

| | | | |
|---|---|---|---|
| CN | 204628094 U | 9/2015 | |
| CN | 105715564 A | 6/2016 | |
| EP | 2677174 A2 * | 12/2013 | ............. F04D 17/06 |

OTHER PUBLICATIONS

Raw Machine Translation of CN204628094 (U), Cai Xujie, Axial fan, Sep. 9, 2015.

* cited by examiner

FAN

CROSS REFERENCE TO RELATED APPLICATIONS

This Non-provisional application is a Divisional Application (DA) of U.S. Ser. No. 16/022,192, filed on Jun. 28, 2018, which claims priority under 35 U.S.C. § 119(a) on Patent Application No(s). 201710943492.1 filed in People's Republic of China on Oct. 11, 2017, the entire contents of which are hereby incorporated by reference.

BACKGROUND OF THE INVENTION

Field of Invention

The present disclosure relates to a fan and, in particular, to a fan having a fan frame configured with two turning portions.

Related Art

As the enhancement of the performance of electronic devices, a lot of heat will be generated during the operation of electronic devices. If the generated heat cannot be dissipated rapidly, the temperature of the electronic device will increase, thereby causing the damage of the internal components and decreasing the performance and lifetime of the electronic device. In general, a fan is provided in the electronic device for dissipating the generated heat. Moreover, in some electronic devices requiring high-pressure fans, such as air conditioner or vacuum cleaner, two high-speed fans or two motors are connected in series and provided for achieving the needed heat-dissipating effect and the sufficient air pressure, thereby reaching a higher heat dissipation efficiency. However, although the above methods can increase the heat dissipation efficiency, the generated airflow of the two fans will impact the fan frame and the internal components so as to generate a laud operation noise. Besides, the flow field inside the fan frame will also be interfered, so that the airflow cannot be concentrated, which can decrease the performance of the fans and increase the operation noise.

Therefore, it is an important subject to provide the sufficient air quantity for dissipating heat and increase the heat dissipation efficiency with a single fan motor, thereby lowering the manufacturing cost and decreasing the operation noise.

SUMMARY OF THE INVENTION

To achieve the above, the present disclosure provides a fan including a fan frame and a driving device. The fan frame includes a base, a frame shell and a plurality of static blades. The static blades are arranged on a periphery of the base and connected between the base and the frame shell. The driving device is disposed on the base and includes a stator structure and a rotor structure. The stator structure includes a stator magnetic pole group and a bushing. The stator magnetic pole group is disposed on the base, and at least a part of the bushing is protruded beyond the stator magnetic pole group. The rotor structure is disposed corresponding to the stator structure and includes at least a bearing, a shaft, a rotor shell, a magnetic structure and a plurality of blades. The bearing is disposed in the bushing, and the shaft is disposed through the bearing. The rotor shell is connected with the shaft. The magnetic structure is disposed corresponding to the stator magnetic pole group, and the stator magnetic pole group magnetically drives the magnetic structure to rotate the shaft and the rotor shell. The blades are arranged on a periphery of the rotor shell, and the blades are disposed corresponding to the frame shell. Two ends of the frame shell adjacent to the blades are configured with a first turning portion and a second turning portion, respectively. The first and second turning portions are disposed between parts of the frame shell with different curvatures.

In one embodiment, a radius from the second turning portion to a center of the shaft is greater than a radius from the first turning portion to the center of the shaft.

In one embodiment, an outer shape of the frame shell includes at least an arc surface, at least a curved surface, at least a planar surface, at least a slant surface, or any combination thereof.

In one embodiment, a diameter of the rotor shell close to the first turning portion is less than a diameter of the rotor shell close to the second turning portion, and an outer shape of the rotor shell is gradually expanded from the first turning portion to the second turning portion.

In one embodiment, a surface of the rotor shell facing the blades includes at least an arc surface, at least a curved surface, at least a slant surface, or any combination thereof.

In one embodiment, the blades are obliquely disposed along a periphery of the rotor shell, and distances from sides of the blades facing the frame shell to an inner wall of the frame shell are equivalent.

In one embodiment, a ratio of a maximum height of the blade to a maximum height of the static blade is 1~4.

In one embodiment, the frame shell includes a first and a second sub frame shells, the first sub frame shell is engaged with the second frame, the first sub frame shell is located corresponding to the rotor shell and the blades, and the static blades are annularly disposed between the base and the second sub frame shell.

In one embodiment, one end of the frame shell is formed with a radial shrinking structure toward the first turning portion, and the radial shrinking structure includes at least an arc surface, at least a curved surface, at least a planar surface, at least a slant surface, or any combination thereof.

In one embodiment, one end of the frame shell is formed with a cylindrical structure toward the first turning portion.

In one embodiment, one end of the frame shell is formed with a radial expanding structure from the first turning portion to the second turning portion, and the radial expanding structure includes at least an arc surface, at least a curved surface, at least a planar surface, at least a slant surface, or any combination thereof.

In one embodiment, the stator magnetic pole group is disposed at an outer periphery of the magnetic structure.

In one embodiment, the base is formed with a radial shrinking structure from one end of the base configured with the static blades, and the radial shrinking structure includes at least an arc surface, at least a curved surface, at least a planar surface, at least a slant surface, or any combination thereof.

In one embodiment, the stator structure further includes an upper shell disposed corresponding to the base.

In one embodiment, the fan further includes at least a fixing structure embedded between the upper shell and the base, and the fixing structure connects and fixes the upper shell to the base.

In one embodiment, the fixing structure is a screw structure or an engaging structure.

In one embodiment, the upper shell has a positioning portion corresponding to a positioning portion of the base, and the stator magnetic pole group or the magnetic structure is limited between the positioning portions.

In one embodiment, at least a part of the bushing protrudes beyond the upper shell, and one end of the bearing disposed on the bushing is disposed corresponding to the upper shell. Otherwise, another end of the bearing disposed on the bushing protrudes beyond the upper shell.

In one embodiment, the magnetic structure is disposed at an outer periphery of the stator magnetic pole group, and the rotor structure further includes a magnetic shell disposed between an inner wall of the rotor shell and an outer periphery of the magnetic structure.

In one embodiment, the base further includes a first base, a second base and a supporting sleeve. The second base and the supporting sleeve are disposed inside the first base, the second base is disposed between the supporting sleeve and the first base, the stator magnetic pole group is disposed at one end of the supporting sleeve, the bushing is disposed inside the stator magnetic pole group and the supporting sleeve, and a maximum diameter of the rotor shell close to the second turning portion is corresponding to a diameter of the first base.

In one embodiment, one end of the bearing disposed on the bushing is located corresponding to the stator magnetic pole group. Otherwise, another end of the bearing disposed on the bushing is located corresponding to the supporting sleeve.

In one embodiment, the rotor structure further includes another bearing disposed in the bushing, and at least one of the bearing protrudes from the stator magnetic pole group.

In one embodiment, a ratio of a maximum height of the blade to a height of the fan is 0.3~0.7.

As mentioned above, the fan frame of the fan of this disclosure is configured with a first and a second turning portions for concentrating the airflow and providing the radial pressure. In addition, the outer shape of the rotor shell is gradually expanded, and the blades are obliquely disposed. Thus, the impact frequency between the airflow and the internal components of the fan can be reduced, so that the flow field inside the fan frame becomes steady. Accordingly, the sufficient air pressure and air quantity can be provided, and the operation noise of the fan can be decreased, thereby improving the operation performance of the fan.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
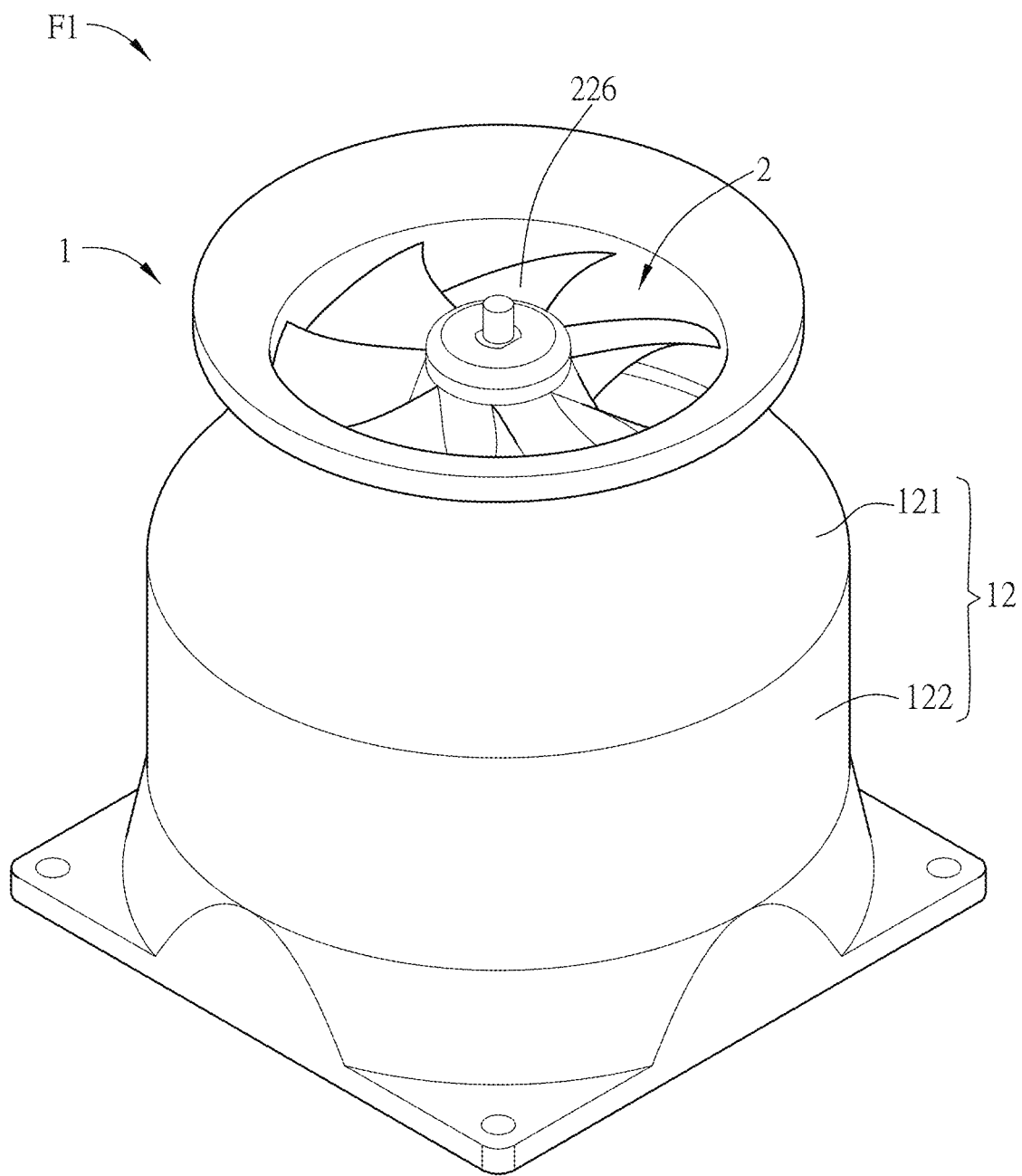
FIG. 1A is a schematic diagram showing a fan according to a first embodiment of the disclosure.
Figure 1B:
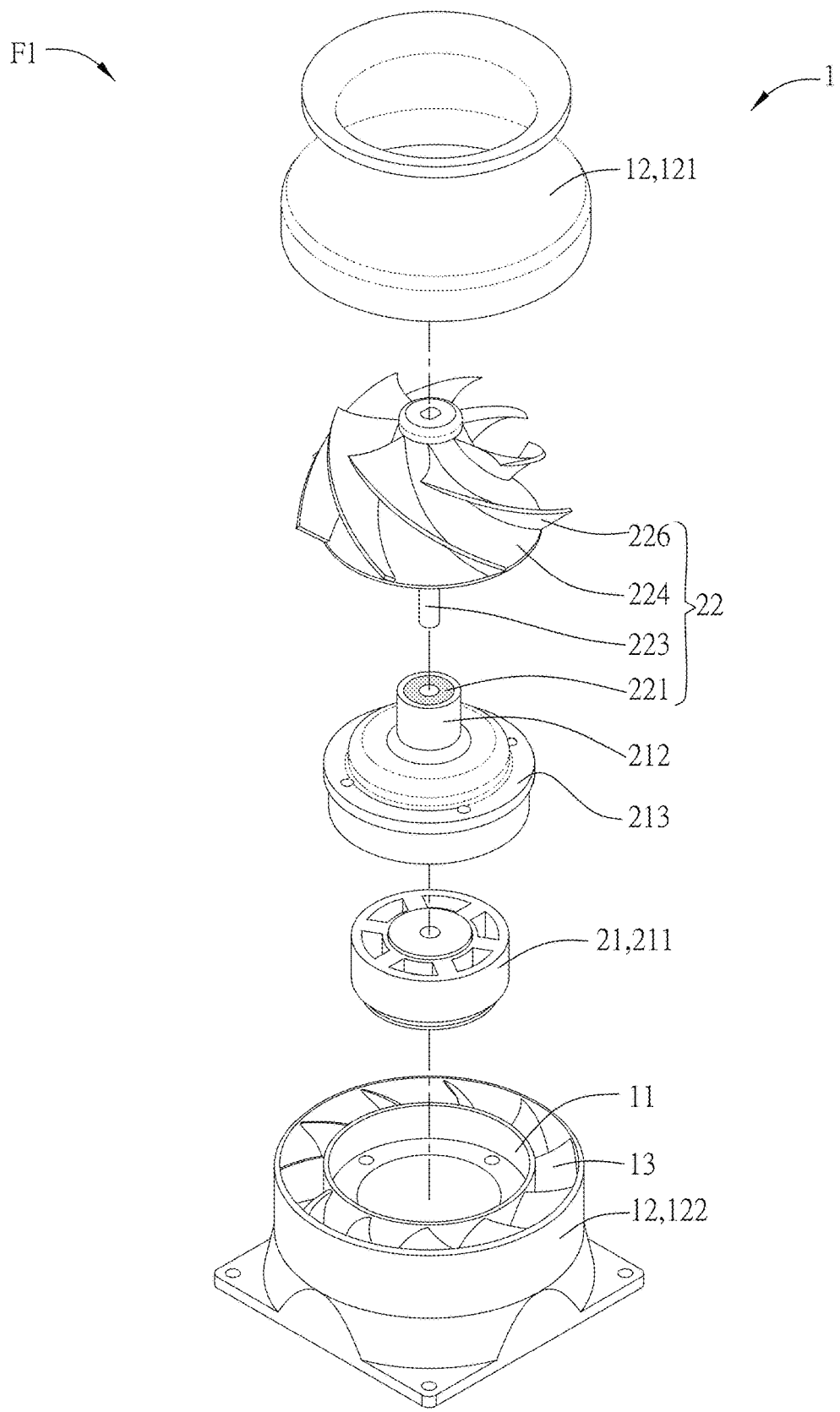
FIG. 1B is an exploded view of the fan of FIG. 1A.
Figure 1C:
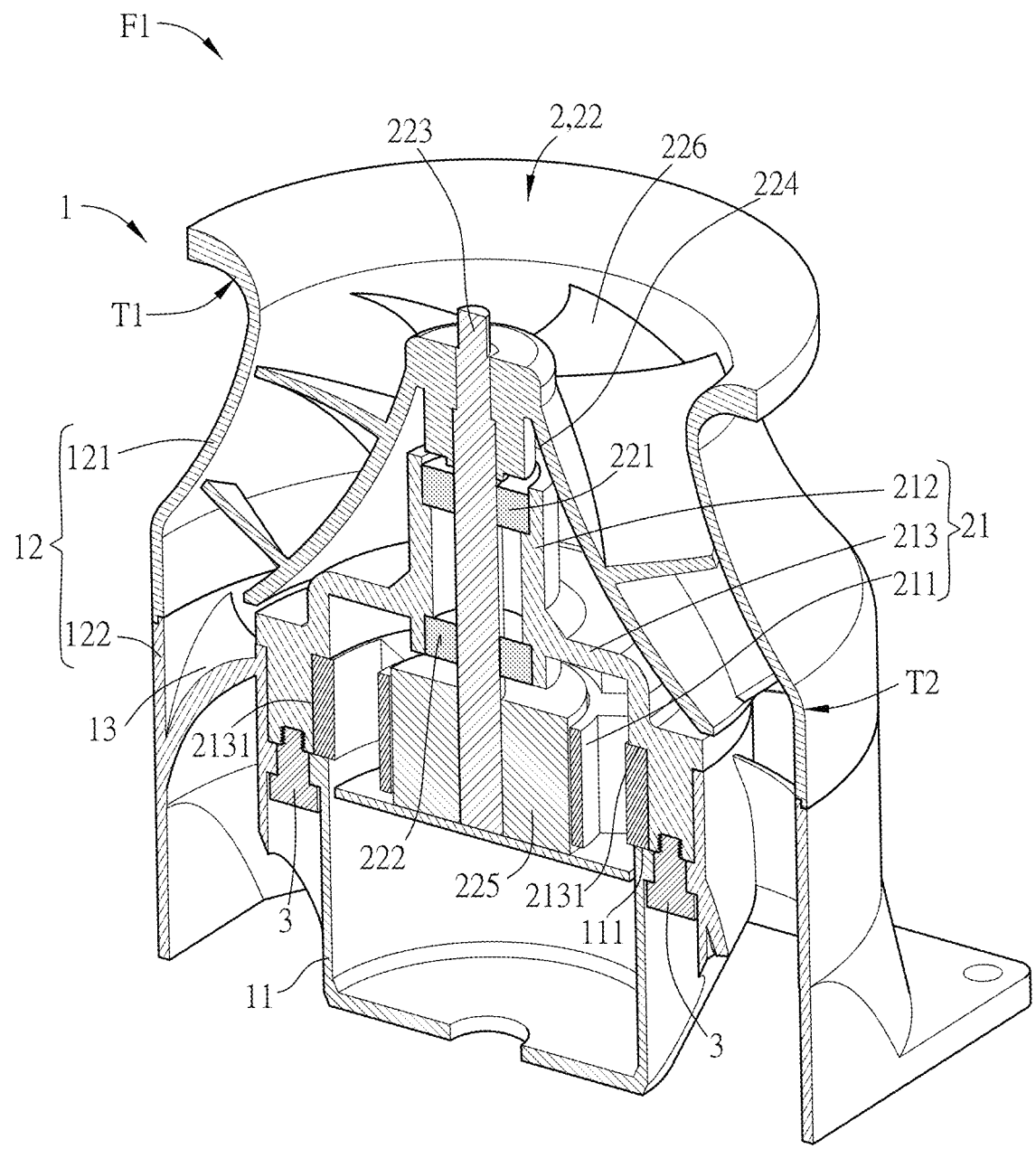
FIG. 1C is a sectional perspective view of the fan of FIG. 1A.
Figure 1D:
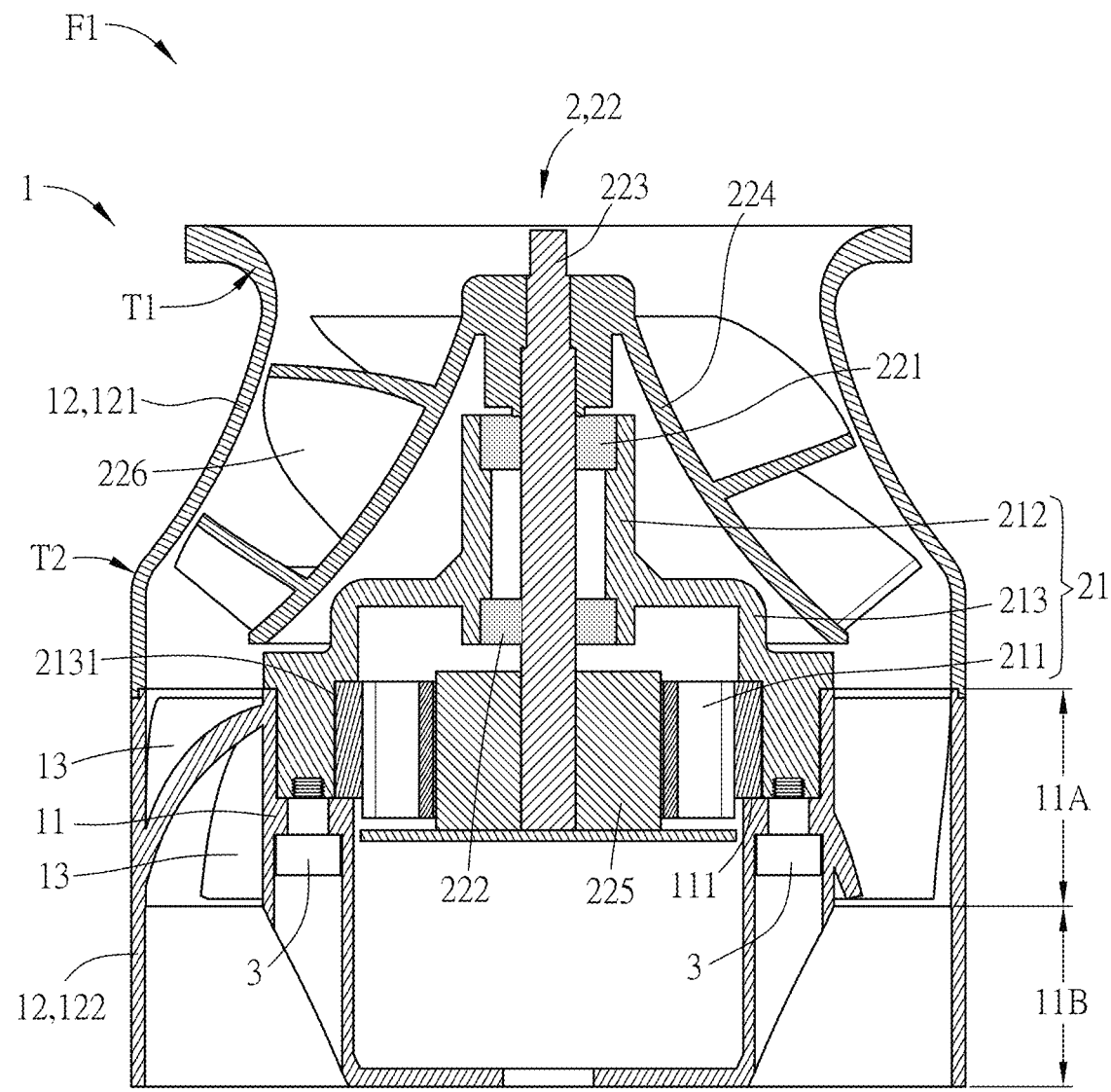
FIG. 1D is a sectional front view of the fan of FIG. 1A.

The basic structure and features of a fan according to a first embodiment of the disclosure will be described hereinafter with reference to FIGS. 1A to 1D. FIG. 1A is a schematic diagram showing a fan according to a first embodiment of the disclosure, FIG. 1B is an exploded view of the fan of FIG. 1A, FIG. 1C is a sectional perspective view of the fan of FIG. 1A, and FIG. 1D is a sectional front view of the fan of FIG. 1A.

The first embodiment of the present disclosure provides a fan F1 including a fan frame 1 and a driving device 2. The fan frame 1 includes a base 11, a frame shell 12, and a plurality of static blades 13. The static blades 13 are arranged on a periphery of the base 11 and connected between the base 11 and the frame shell 12. The static blades are disposed at the upper end 11A of the base 11, and the lower end 11B of the base 11 is formed with a radial shrinking structure. In more detailed, an upper part of the base 11 close to the rotor shell 224 is defined as the upper end 11A of the base 11, which is configured with the static blades 13. As shown in the figures, a lower part of the base 11, which is configured without the static blades 13, is defined as the lower end 11B of the base 11. The lower end 11B of the base 11 is gradually shrunk along a direction away from the static blades 13.

The driving device 2 is disposed on the base 11 and includes a stator structure 21 and a rotor structure 22. The stator structure 21 includes a stator magnetic pole group 211 and a bushing 212. The stator magnetic pole group 211 is disposed on the base 11, and at least a part of the bushing 212 is protruded beyond the stator magnetic pole group 211. The rotor structure 22 is disposed corresponding to the stator structure 21 and includes at least a bearing 221, a shaft 223, a rotor shell 224, a magnetic structure 225, and a plurality of blades 226. The bearing 221 is disposed in the bushing 212, and the shaft 223 is disposed through the bearing 221. The rotor shell 224 is connected with the shaft 223. The magnetic structure 225 is disposed corresponding to the stator magnetic pole group 211, and the stator magnetic pole group 211 magnetically drives the magnetic structure 225 to rotate the shaft 223 and the rotor shell 224. The blades 226 are arranged on a periphery of the rotor shell 224, and the blades 226 are disposed corresponding to the frame shell 12. The stator magnetic pole group 211 is disposed on, for example but not limited to, the outer periphery of the magnetic structure 225, so that the driving device 2 becomes an internal rotor structure 22. In addition, according to the design requirement of the internal flow field of the fan F1, the magnetic structure 225 can be disposed on the outer periphery of the stator magnetic pole group 211, so that the driving device 2 becomes an external rotor structure 22.

In this embodiment, the rotor structure 22 can further include another bearing 222, which is disposed in the bushing 212. In more specific, the bearings 221 and 222 are disposed inside the bushing 212. At least one bearing 221 is protruded beyond the stator magnetic pole group 211, and the shaft 223 is disposed through the bearings 221 and 222. The rotor shell 224 is connected to the shaft 223.

The detailed designs of the frame shell 12, the static blades 13 and the rotor structure 22 of this embodiment will be described hereinafter with reference to FIGS. 1C and 1D.

In this embodiment, two ends of the frame shell 12 adjacent to the blades 226 are configured with a first turning portion T1 and a second turning portion T2, respectively. The first and second turning portions T1, T2 are disposed between parts of the frame shell 12 with different curvatures. A radius from the second turning portion T2 to a center of the shaft 223 is greater than a radius from the first turning portion T1 to the center of the shaft 223. In this embodiment, according to different requirements for flow field, an outer shape of the frame shell 12 includes at least an arc surface, at least a curved surface, at least a planar surface, at least a slant surface, or any combination thereof. The frame shell 12 can be formed by the arc surface or curved surface with different curvatures, or the planar surface or slant surface with different slopes. The frame shell 12 can also include at least a guiding angle or at least a reverse angle.

In more specific, the first turning portion T1 is around the part of the upper end of the frame shell 12 having the maximum curvature. The first turning portion T1 is an inflection point for connecting a part of the frame shell 12 above the first turning portion T1 and a part of the frame shell 12 below the first turning portion T1. The upper end of the frame shell 12 is formed with a radial shrinking structure toward the first turning portion T1, and the radial shrinking structure includes at least an arc surface, at least a curved surface, at least a planar surface, at least a slant surface, or any combination thereof. Accordingly, the airflow can enter through the upper end of the frame shell 12 so as to achieve the concentration of the airflow. In addition, according to the design requirement for flow field, the upper end of the frame shell 12 can be formed with a cylindrical structure toward the first turning portion T1 for achieving the effect of primarily controlling the air quantity.

Similarly, the second turning portion T2 is around the part of the lower end of the frame shell 12 (below the first turning portion T1) having the maximum curvature. The second turning portion T2 is an inflection point for connecting a part of the frame shell 12 below the first turning portion T1 and a part of the frame shell 12 below the second turning portion T2. The lower end of the frame shell 12 is formed with a radial expanding structure from the first turning portion T1 to the second turning portion T2, and the radial expanding structure includes at least an arc surface, at least a curved surface, at least a planar surface, at least a slant surface, or any combination thereof. Accordingly, after the airflow is concentrated at the first turning portion T1 of the frame shell 12, the airflow can flow from the first turning portion T1 to the second turning portion T2, thereby achieving the effects of airflow concentration and pressure increasing.

Referring to FIGS. 1B, 1C and 1D, in this embodiment, a diameter of the rotor shell 224 close to the first turning portion T1 is less than a diameter of the rotor shell 224 close to the second turning portion T2. An outer shape of the rotor shell 224 is gradually expanded from the first turning portion T1 to the second turning portion T2. In addition, a surface of the rotor shell 224 facing the blades 226 includes at least an arc surface, at least a curved surface, at least a slant surface, or any combination thereof. In more specific, the outer shape of the rotor shell 224 is gradually expanded from top to bottom. Besides, the outline of the rotor shell 224 is composed by a concave arc surface or a concave curved surface so that the rotor shell 224 is formed similar to a cone structure. The blades 226 are obliquely disposed along a periphery of the rotor shell 224. In more detailed, the blades 226 are obliquely disposed along the outline of the rotor shell 224, and the distances from the sides of the blades 226 facing the frame shell 12 to an inner wall of the frame shell 12 are equivalent. Thus, the sides of the blades 226 close to the frame shell 12 has a shape corresponding to the shape of the frame shell 12. Since the shapes of the rotor shell 224 and the blades 226 are corresponding to the shape of frame shell 12, the airflow can be effective pressured after entering the frame shell 12. This configuration can reduce the impact frequency between the airflow and the internal components of the fan F1, steady the flow field inside the fan frame 12, provide the sufficient air pressure and air quantity, and decrease the operation noise of the fan F1.

Furthermore, in this embodiment, a ratio of a maximum height of the blade 226 to a maximum height of the static blade 13 is 1~4, and a ratio of a maximum height of the blade 226 to a height of the fan F1 is 0.3~0.7. The base 11 is formed with a radial shrinking structure from the upper end 11A of the base 11 that is configured with the static blades 13 to the lower end 11B of the base 11 that is configured without the static blades 13. The radial shrinking structure includes at least an arc surface, at least a curved surface, at least a planar surface, at least a slant surface, or any combination thereof. In more specific, the upper end 11A of the base 11 is close to the rotor shell 224 and is configured with the static blades 13. The lower end 11B of the base 11 is not configured with the static blades 13, and the lower end of the base 11 is formed with a radial shrinking structure toward a direction away from the static blades 13. Based on the designs of the maximum heights of the blades 226 and the static blades 13 and the radial shrinking structure of the base 11 toward the direction away from the static blades 13, the internal flow field inside the frame shell 12 can be steadied and the sufficient air pressure and air quantity can be provide when the airflow flows through the frame shell 12. Accordingly, the flow field inside the frame shell 12 can be perfectly controlled.

In order to increase the convenience for assembling, the frame shell 12 of this embodiment includes a first and a second sub frame shells 121, 122. The first sub frame shell 121 is engaged with the second sub frame shell 122, and the first sub frame shell 121 is located corresponding to the rotor shell 224 and the blades 226. The static blades 13 are annularly disposed between the base 11 and the second sub frame shell 122. After assembling the stator structure 21 and the rotor structure 22 in the base 11, the first and second sub frame shells 121, 122 can be directly engaged to finish the entire assembling procedure of the fan F1.

The stator structure 21 further includes an upper shell 213 disposed corresponding to the base 11. The fan F1 further includes at least a fixing structure 3 embedded between the upper shell 213 and the base 11, and the fixing structure 3 connects and fixes the upper shell 213 to the base 11. In this embodiment, the fixing structure 3 can be, for example but not limited to, a screw structure or an engaging structure. The screw structure can be a screw and the engaging structure can be a bolt or a latch. In this case, the upper shell 213 has at least a positioning portion 2131, and the base 11 has a positioning portion 111 corresponding to the positioning portion 2131. The stator magnetic pole group 211 or the magnetic structure 225 is limited between the positioning portions 111 and 2131. Accordingly, the stator magnetic pole group 211 or the magnetic structure 225 can be disposed and fixed between the upper shell 213 and the base 11 without additional fixing mechanism.

In addition, as shown in FIGS. 1C and 1D, two bearings 221 and 222 are protruded beyond the stator magnetic pole group. At least a part of the bushing 212 protrudes beyond the upper shell 213. One bearing 222 is disposed in the lower end of the bushing 212 and located corresponding to the upper shell 213. The bearing 222 disposed in the lower end of the bushing 212 can be located within a range defined by the upper shell 213. The other bearing 221 is disposed in the upper end of the bushing 212 and protruded beyond the upper shell 213. This embodiment is not limited to the above aspect with two bearings. In some embodiments, the rotor structure may include a single bearing. For example, the bearing 222 can also be disposed in the other end of the bushing 212 and protruded beyond the upper shell 213. The bearing can be a ball bearing or an oil bearing. In addition, in the aspect that the rotor structure includes two bearings, the bearing 222 is not needed to be protruded beyond the upper shell 213.

Figure 2A:
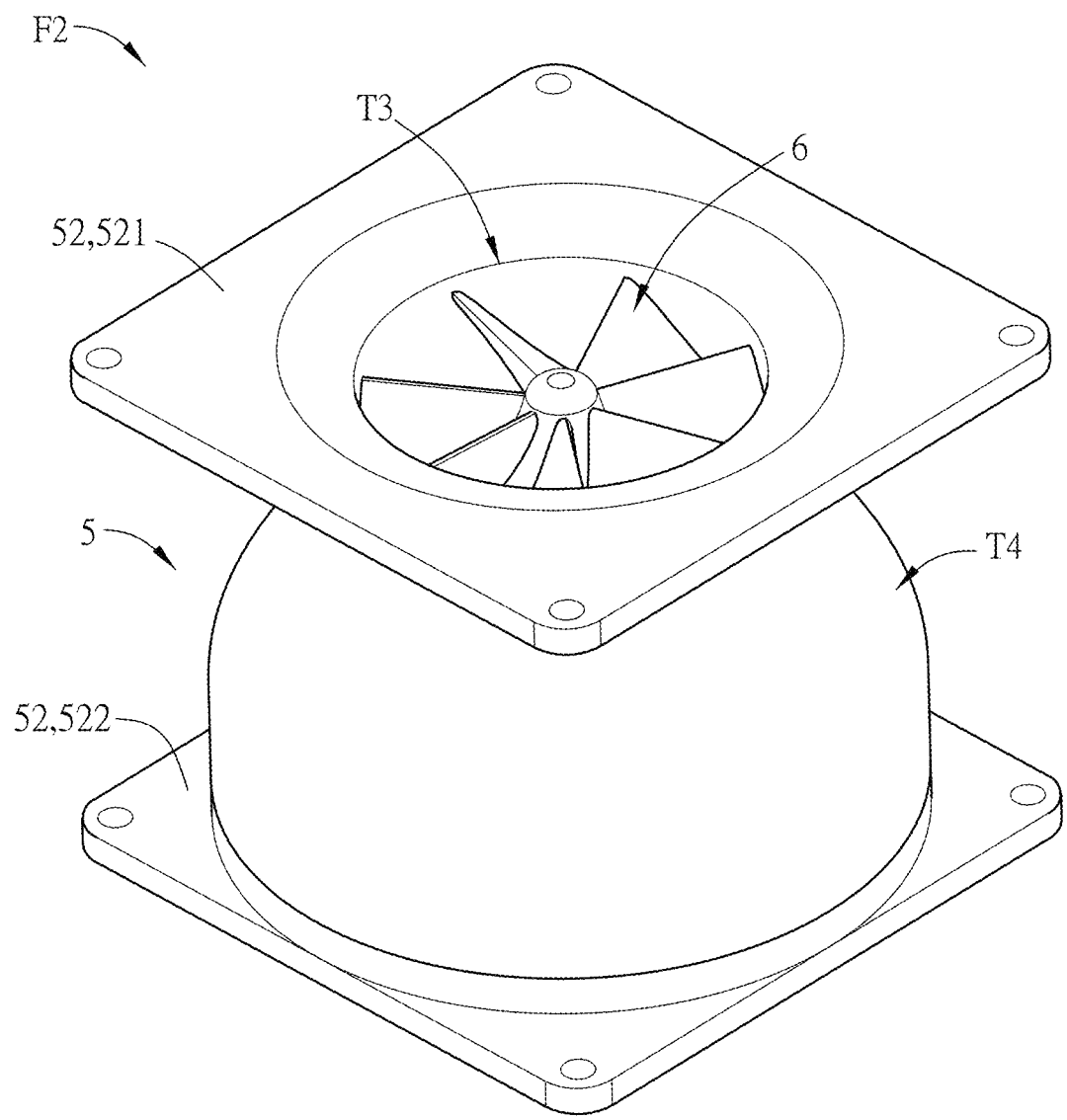
FIG. 2A is a schematic diagram showing a fan according to a second embodiment of the disclosure.
Figure 2B:
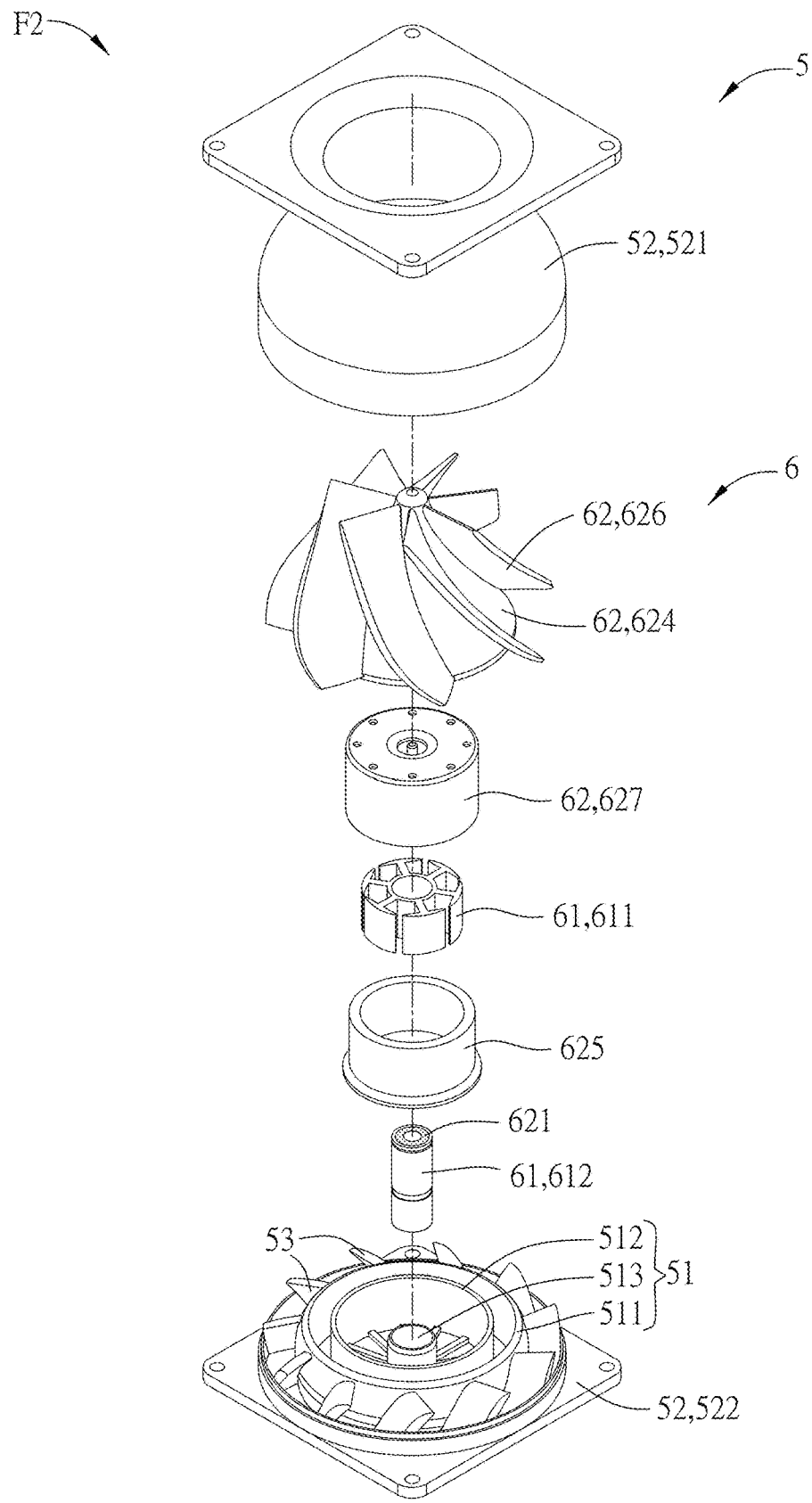
FIG. 2B is an exploded view of the fan of FIG. 2A.
Figure 2C:
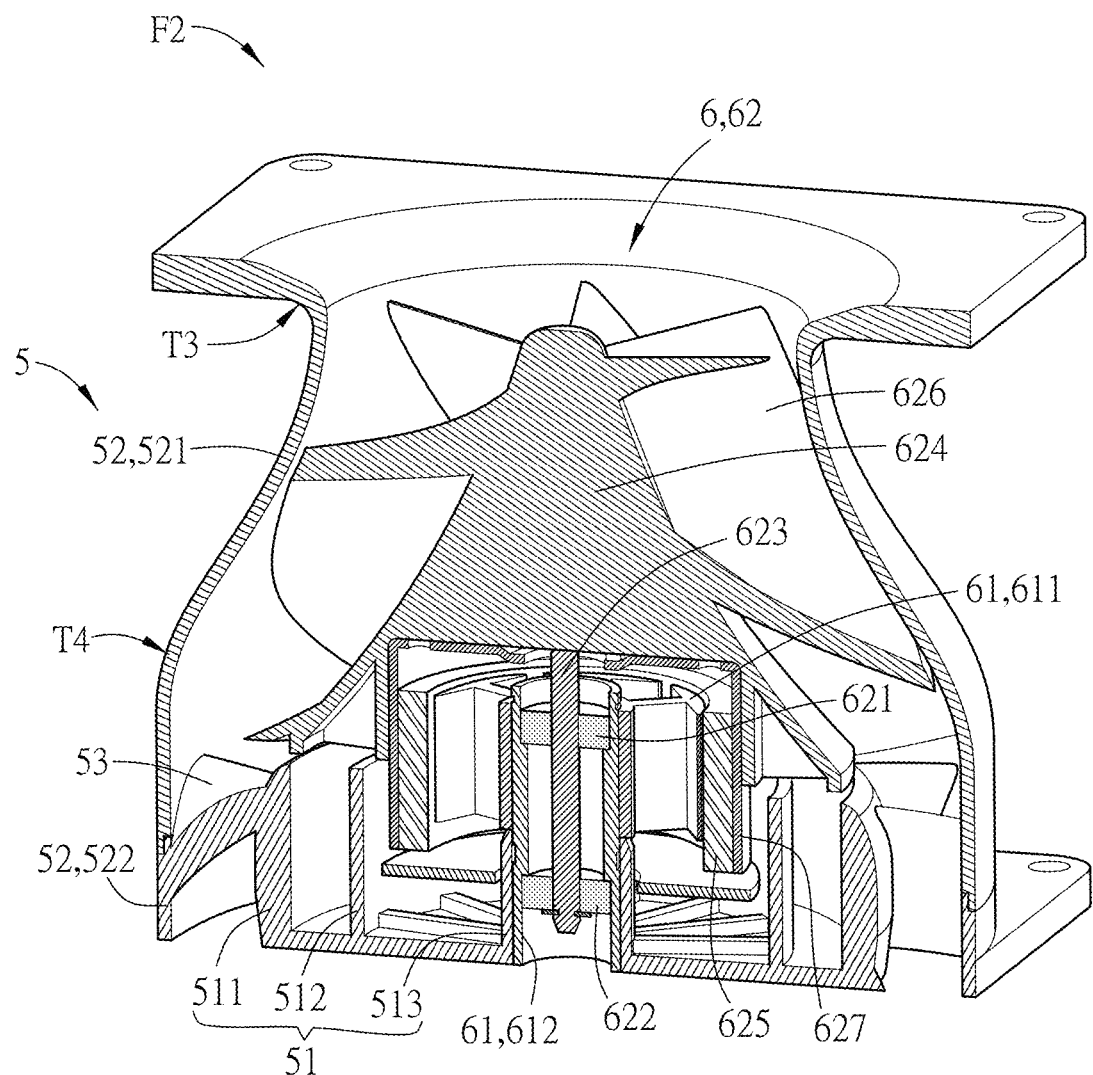
FIG. 2C is a sectional perspective view of the fan of FIG. 2A.
Figure 2D:
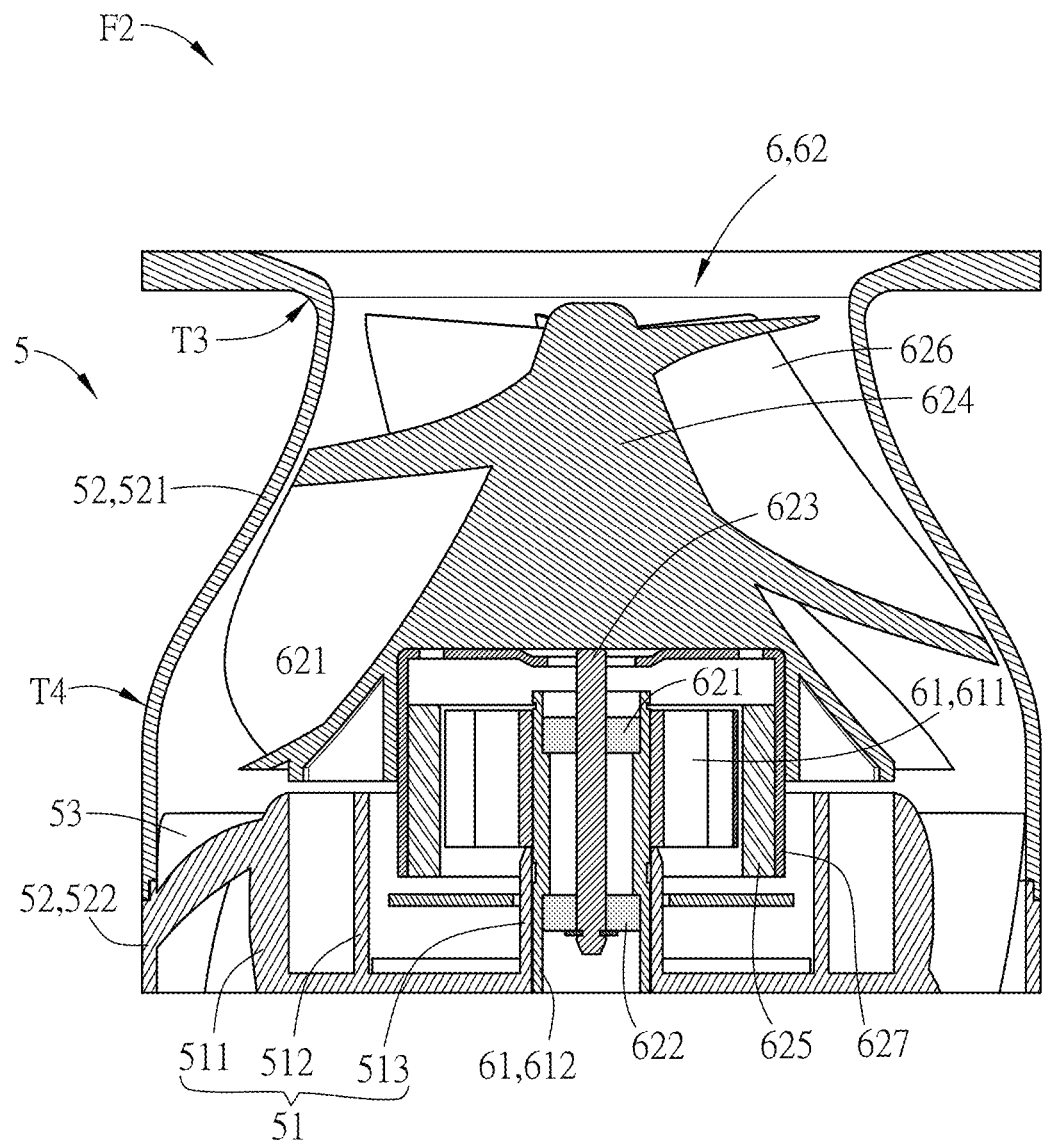
FIG. 2D is a sectional front view of the fan of FIG. 2A.

The basic structure and features of a fan according to a second embodiment of the disclosure will be described hereinafter with reference to FIGS. 2A to 2D. FIG. 2A is a schematic diagram showing a fan according to a second embodiment of the disclosure, FIG. 2B is an exploded view of the fan of FIG. 2A, FIG. 2C is a sectional perspective view of the fan of FIG. 2A, and FIG. 2D is a sectional front view of the fan of FIG. 2A.

The second embodiment of the present disclosure provides a fan F2 including a fan frame 5 and a driving device 6. The fan frame 5 includes a base 51, a frame shell 52, and a plurality of static blades 53. The static blades 53 are arranged on a periphery of the base 51 and connected between the base 51 and the frame shell 52. The driving device 6 is disposed on the base 51 and includes a stator structure 61 and a rotor structure 62. The stator structure 61 includes a stator magnetic pole group 611 and a bushing 612. The stator magnetic pole group 611 is disposed on the base 51, and at least a part of the bushing 612 is protruded beyond the stator magnetic pole group 611. The rotor structure 62 is disposed corresponding to the stator structure 61 and includes at least a bearing 621, a shaft 623, a rotor shell 624, a magnetic structure 625, and a plurality of blades 626. The bearing 621 is disposed in the bushing 612, and the shaft 623 is disposed through the bearing 621. The rotor shell 624 is connected with the shaft 623. The magnetic structure 625 is disposed corresponding to the stator magnetic pole group 611, and the stator magnetic pole group 621 magnetically drives the magnetic structure 625 to rotate the shaft 623 and the rotor shell 624. The blades 626 are arranged on a periphery of the rotor shell 624, and the blades 626 are disposed corresponding to the frame shell 52. The magnetic structure 625 is disposed on, for example but not limited to, the outer periphery of the stator magnetic pole group 611, so that the driving device 6 becomes an external rotor structure 62. In addition, according to the design requirement of the internal flow field of the fan F2, the stator magnetic pole group 611 can be disposed on the outer periphery of the magnetic structure 625 so that the driving device 6 becomes an internal rotor structure 62.

In this embodiment, the rotor structure 62 can further include another bearing 622, which is disposed in the bushing 612. In more specific, the bearings 621 and 622 are disposed inside the bushing 612. At least one bearing 621 is protruded beyond the stator magnetic pole group 611, and the shaft 623 is disposed through the bearings 621 and 622. The rotor shell 624 is connected to the shaft 623.

In addition, the rotor structure 62 further includes a magnetic shell 627 disposed between an inner wall of the rotor shell 624 and an outer periphery of the magnetic structure 625. The material of the rotor shell 624 and the blades 626 can be plastic materials formed by ejection molding, or metal material.

In this embodiment, the base 51 further includes a first base 511, a second base 512, and a supporting sleeve 513. The second base 512 and the supporting sleeve 513 are disposed inside the first base 511. The second base 512 is disposed between the supporting sleeve 513 and the first base 511. The stator magnetic pole group 611 is disposed at one end of the supporting sleeve 513. The bushing 612 is disposed inside the stator magnetic pole group 611 and the supporting sleeve 513. As shown in the figures, the bearing 621 is disposed in the upper end of the bushing 612 and located corresponding to the stator magnetic pole group 611. The other bearing 622 is disposed in the lower end of the bushing 612 and located corresponding to the supporting sleeve 513. The bearing 622 is protruded beyond the bottom of the stator magnetic pole group 611. In addition, a maximum diameter of the rotor shell 624 close to the second turning portion T4 is corresponding to a diameter of the first base 511. That is, the maximum diameter of the bottom of the rotor shell 624 is corresponding to the diameter of the top of the first base 511. This embodiment is not limited to the above aspect with two bearings. In some embodiments, the rotor structure may include a single bearing. For example, the bearing 621 can also be disposed in the lower end of the bushing 612 and located corresponding to the supporting sleeve 513, so that the bearing 621 is protruded beyond the bottom of the stator magnetic pole group 611. In addition, the bearing 621 can also be disposed in the other end of the bushing 612 and located corresponding to the supporting sleeve 513. The bearing can be a ball bearing or an oil bearing. In addition, in the aspect that the rotor structure includes two bearings, the bearing 622 is not needed to be protruded beyond the bottom of the stator magnetic pole group 611.

The detailed designs of the frame shell 52, the static blades 53 and the rotor structure 62 of this embodiment will be described hereinafter with reference to FIGS. 2C and 2D. In this embodiment, two ends of the frame shell 52 adjacent to the blades 626 are configured with a first and a second turning portions T3, T4, respectively. The first and second turning portions T3, T4 are disposed between parts of the frame shell 52 with different curvatures. A radius from the second turning portion T4 to a center of the shaft 623 is greater than a radius from the first turning portion T3 to the center of the shaft 623. In this embodiment, according to different requirements for flow field, an outer shape of the frame shell 52 includes at least an arc surface, at least a curved surface, at least a planar surface, at least a slant surface, or any combination thereof. The frame shell 52 can be formed by the arc surface or curved surface with different curvatures, or the planar surface or slant surface with different slopes. The frame shell 52 can also include at least a guiding angle or at least a reverse angle.

In more specific, the first turning portion T3 is around the part of the upper end of the frame shell 52 having the maximum curvature. The first turning portion T3 is an inflection point for connecting a part of the frame shell 52 above the first turning portion T3 and a part of the frame shell 52 below the first turning portion T3. The upper end of the frame shell 52 is formed with a radial shrinking structure toward the first turning portion T3, and the radial shrinking structure includes at least an arc surface, at least a curved surface, at least a planar surface, at least a slant surface, or any combination thereof. Accordingly, the airflow can enter through the upper end of the frame shell 52 so as to achieve the concentration of the airflow.

Similarly, the second turning portion T4 is around the part of the lower end of the frame shell 52 below the first turning portion T3 having the maximum curvature. The second turning portion T4 is an inflection point for connecting a part of the frame shell 52 below the first turning portion T3 and a part of the frame shell 52 below the second turning portion T4. The lower end of the frame shell 52 is formed with a radial expanding structure from the first turning portion T3 to the second turning portion T4, and the radial expanding structure includes at least an arc surface, at least a curved surface, at least a planar surface, at least a slant surface, or any combination thereof. Accordingly, after the airflow is concentrated at the first turning portion T3 of the frame shell 52, the airflow can flow from the first turning portion T3 to the second turning portion T4, thereby achieving the effects of airflow concentration and pressure increasing.

Referring to FIGS. 2B, 2C and 2D, in this embodiment, a diameter of the rotor shell 624 close to the first turning portion T3 is less than a diameter of the rotor shell 624 close to the second turning portion T4, and an outer shape of the rotor shell 624 is gradually expanded from the first turning portion T3 to the second turning portion T4. In addition, a surface of the rotor shell 624 facing the blades 626 includes at least an arc surface, at least a curved surface, at least a slant surface, or any combination thereof. In more specific, the outer shape of the rotor shell 624 is gradually expanded from top to bottom. Besides, the outline of the rotor shell 624 is composed by a concave arc surface or a concave curved surface, so that the rotor shell 624 is formed similar to a cone structure. The blades 626 are obliquely disposed along a periphery of the rotor shell 624. In more detailed, the blades 626 are obliquely disposed along the outline of the rotor shell 624, and the distances from the sides of the blades 626 facing the frame shell 52 to an inner wall of the frame shell 52 are equivalent. Thus, the sides of the blades 626 close to the frame shell 52 has a shape corresponding to the shape of the frame shell 52. Since the shapes of the rotor shell 624 and the blades 626 are corresponding to the shape of the frame shell 52, the airflow can be effective pressured after entering the frame shell 52. This configuration can reduce the impact frequency between the airflow and the internal components of the fan F2, steady the flow field inside the fan frame 52, provide the sufficient air pressure and air quantity, and decrease the operation noise of the fan F2.

Furthermore, in this embodiment, a ratio of a maximum height of the blade 626 to a maximum height of the static blade 53 is 1~4, and a ratio of a maximum height of the blade 626 to a height of the fan F2 is 0.3~0.7. Based on the designs of the maximum heights of the blades 626 and the static blades 53, the internal flow field inside the frame shell 52 can be steadied and the sufficient air pressure and air quantity can be provide when the airflow flows through the frame shell 52. Accordingly, the flow field inside the frame shell 52 can be perfectly controlled.

In order to increase the convenience for assembling, the frame shell 52 of this embodiment includes a first and a second sub frame shells 521, 522. The first sub frame shell 521 is engaged with the second sub frame shell 522, and the first sub frame shell 521 is located corresponding to the rotor shell 624 and the blades 626. The static blades 53 are annularly disposed between the base 51 and the second sub frame shell 522.

In summary, the fan frame of the fan of this disclosure is configured with two turning portions for concentrating the airflow entering from the upper end of the frame shell and providing the radial pressure. In addition, the outer shapes of the rotor shell and the blades are corresponding to the outer shape of the frame shell, so that the airflow can be effectively pressured after entering from the frame shell. Thus, the impact frequency between the airflow and the internal components of the fan can be reduced, so that the flow field inside the fan frame becomes steady. Accordingly, the sufficient air pressure and air quantity can be provided, and the operation noise of the fan can be decreased, thereby improving the operation performance of the fan.

In addition, the frame shell can be assembled by two sub frame shells. Accordingly, after assembling the stator structure and the rotor structure in the base, the two sub frame shells can be directly engaged to finish the entire assembling procedure of the fan. This design can improve the convenience of assembling.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A fan comprising:
  a fan frame comprising a base, a frame shell and a plurality of static blades, wherein the plurality of static blades is arranged on a periphery of the base and connected between the base and the frame shell, the frame shell has an inlet opening, the inlet opening has a bell mouth shape; and
  a driving device disposed on the base and comprising:
  a stator structure comprising a stator magnetic pole group and a bushing, wherein the stator magnetic pole group is disposed on the base, and at least a part of the bushing is protruded beyond the stator magnetic pole group; and
  a rotor structure corresponding to the stator structure and comprising:
  at least a bearing disposed in the bushing,
  a shaft disposed through the bearing,
  a rotor shell connected with the shaft,
  a magnetic structure disposed at an outer periphery of the stator magnetic pole group, wherein the stator magnetic pole group magnetically drives the magnetic structure to rotate the shaft and the rotor shell,
  a magnetic shell disposed between an inner wall of the rotor shell and an outer periphery of the magnetic structure, and
  a plurality of blades arranged on a periphery of the rotor shell, wherein the plurality of blades arranged on the periphery of the rotor shell are disposed corresponding to the frame shell;
  wherein two ends of the frame shell adjacent to the plurality of blades arranged on the periphery of the rotor shell are configured with a first turning portion and a second turning portion, respectively, and the first turning portion and the second turning portion are disposed between parts of the frame shell with different curvatures, a curvature of the first turning portion is larger than a curvature of the second turning portion, the first turning portion is higher than the second turning portion in an axial direction, the second turning portion of the frame shell is higher than a lowest portion of the periphery of the rotor shell in the axial direction,
  wherein the base further comprises a first base, a second base and a supporting sleeve, the second base and the supporting sleeve are disposed inside the first base, the second base is disposed between the supporting sleeve and the first base, the stator magnetic pole group is disposed at one end of the supporting sleeve, the bushing is disposed inside the stator magnetic pole group and the supporting sleeve, and a maximum diameter of the rotor shell close to the second turning portion is corresponding to a diameter of the first base.

2. The fan according to claim 1, wherein a radius from the second turning portion to a center of the shaft is greater than a radius from the first turning portion to the center of the shaft.

3. The fan according to claim 1, wherein an outer shape of the frame shell comprises at least an arc surface, at least a curved surface, at least a planar surface, at least a slant surface, or any combination thereof.

4. The fan according to claim 1, wherein a diameter of the rotor shell close to the first turning portion is less than a diameter of the rotor shell close to the second turning portion, and an outer shape of the rotor shell is gradually expanded from the first turning portion to the second turning portion.

5. The fan according to claim 4, wherein a surface of the rotor shell facing the plurality of blades arranged on the periphery of the rotor shell comprises at least an arc surface, at least a curved surface, at least a slant surface, or any combination thereof.

6. The fan according to claim 4, wherein the plurality of blades arranged on the periphery of the rotor shell is being obliquely disposed along the periphery of the rotor shell, and distances from sides of the plurality of blades that are arranged on the periphery of the rotor shell facing the frame shell to an inner wall of the frame shell are equivalent.

7. The fan according to claim 1, wherein a ratio of a maximum height of each blade of the plurality of blades arranged on the periphery of the rotor shell to a maximum height of each static blade of the plurality of the static blades is 1~4.

8. The fan according to claim 1, wherein the frame shell comprises a first sub frame shell and a second sub frame shell, the first sub frame shell is engaged with the second sub frame shell, the first sub frame shell is located corresponding to the rotor shell and the plurality of blades that is arranged on the periphery of the rotor shell, and the plurality of static blades is annularly disposed between the first base and the second sub frame shell.

9. The fan according to claim 1, wherein one end of the frame shell is formed with a radial shrinking structure toward the first turning portion, and the radial shrinking structure of the frame shell comprises at least an arc surface, at least a curved surface, at least a planar surface, at least a slant surface, or any combination thereof.

10. The fan according to claim 1, wherein one end of the frame shell is formed with a radial expanding structure from the first turning portion to the second turning portion, and the radial expanding structure of the frame shell comprises at least an arc surface, at least a curved surface, at least a planar surface, at least a slant surface, or any combination thereof.

11. The fan according to claim 1, wherein the stator magnetic pole group is disposed at an outer periphery of the magnetic structure.

12. The fan according to claim 1, wherein a ratio of a maximum height of each blade of the plurality of blades arranged on the periphery of the rotor shell to a height of the fan is 0.3~0.7.

* * * * *